(12) United States Patent
Leipold et al.

(10) Patent No.: US 8,497,736 B1  
(45) Date of Patent: Jul. 30, 2013

(54) DIRECT DC COUPLED PUSH-PULL BJT DRIVER FOR POWER AMPLIFIER WITH BUILT-IN GAIN AND BIAS CURRENT SIGNAL DEPENDENT EXPANSION

(75) Inventors: Dirk Leipold, Califon, NJ (US); Wade Allen, Brookline, MA (US); Gary Hau, Merrimack, NH (US)

(73) Assignee: Anadigics, Inc., Warren, NJ (US)

( * ) Notice: Subject to any disclaimer, the term of this patent is extended or adjusted under 35 U.S.C. 154(b) by 9 days.

(21) Appl. No.: 13/285,605

(22) Filed: Oct. 31, 2011

Related U.S. Application Data (60) Provisional application No. 61/408,855, filed on Nov. 1, 2010.

(51) Int. Cl.  
*H03F 3/26* (2006.01)

(52) U.S. Cl.  
USPC .......................................................... 330/267

(58) Field of Classification Search  
USPC .................................................. 330/267, 273  
See application file for complete search history.

(56) References Cited

U.S. PATENT DOCUMENTS
6,624,700 B2 * 9/2003 Luo et al. ...................... 330/281

* cited by examiner

*Primary Examiner* — Steven J Mottola  
(74) *Attorney, Agent, or Firm* — William L. Botjer (57) ABSTRACT

A power amplifier having a driver stage and an output stage is configured to provide an amplified RF input signal. The driver stage of the power amplifier consists of one or more driver circuits consisting of a network of transistors, current sources, capacitive elements and resistive elements. An RF input signal is fed into the driver stage which is configured to provide a dynamic DC bias and an RF signal gain to a base terminal of a Bipolar Junction Transistor (BJT) power device present in the output stage. The output stage includes of a network of transistors, capacitive and resistive elements and when driven by the DC bias and the RF signal from the driver stage produces an amplified RF input signal at an output side of the output stage.

17 Claims, 7 Drawing Sheets

DIRECT DC COUPLED PUSH-PULL BJT DRIVER FOR POWER AMPLIFIER WITH BUILT-IN GAIN AND BIAS CURRENT SIGNAL DEPENDENT EXPANSION

CROSS REFERENCE TO RELATED APPLICATIONS

This application claims priority from U.S. provisional application Ser. No. 61/408,855 filed Nov. 1, 2010, the disclosure of which is hereby incorporated by reference.

TECHNICAL FIELD

The present invention relates, in general, to power amplifiers. More specifically, the present invention relates to the driver circuits used in Radio Frequency (RF) and Microwave power amplifiers in the field of cellular communication.

BACKGROUND

Cellular communication systems have entered our daily life since the early nineties. Recent years have seen tremendous improvements in the field of cellular communication which has led to an unprecedented wireless revolution. The main reason for these improvements is the achievable high integration level of Complementary Metal Oxide Semiconductors (CMOS), hereinafter referred to as CMOS. This gave rise to the integration of a huge number of digital functionalities into a single chip which resulted in the powerful cellular communication networks of today. Another important reason for the successful development of cellular communication is the low cost of the user equipment due to the low cost of CMOS transistors.

There are multiple services like telephony, internet, video conference, email, etc being incorporated into the cellular communication systems, nowadays, which demands a higher level of integration in order to keep the cost of the user equipment reasonable and at the same time provide increased battery life time with low power consumption. Equipment of cellular communication networks requires a power amplifier to amplify the radio signal before it is transmitted through the antenna. Therefore, the radio signal is amplified by a power amplifier before it is transmitted through the antenna. Hence the amplification of the radio signal should be done to a desired output power level without consuming too much power in order to save battery lifetime. In other words, besides the required output power, the power amplifier should have sufficient linearity, high efficiency and gain.

In order to achieve the requirements stated above, current commercially viable power amplifiers must be realized in costly compound semiconductor processes such as GaAs. On the other hand, the active field of CMOS power amplifier design needs much effort directed towards the creation of the needed output power using power combiners. In most of the time this is achieved by using transformers on the drain side of the output transistor. However, the low voltage handling capability of normal CMOS transistors forces the usage of very large output impedance transformation ratios, which in turn end up encountering significant losses in the power combining circuit. Therefore, the performance of the power amplifier in terms of maximum output power, power added efficiency and ruggedness is therefore compromised relative to a GaAs based power amplifier.

In view of the foregoing, there is a need for a driver circuit to drive the output power of a power amplifier such that it minimizes the cost incurred due to costly compound semiconductor materials.

SUMMARY OF THE INVENTION

An object of the invention is to provide a driver circuit for delivering dynamic DC bias and RF signal gain to a base terminal of a Bipolar Junction Transistor (BJT) device in a power amplifier. The driver circuit comprises a first transistor, a second transistor, a first current source, a second current source, a first current mirror and a second current mirror. The first transistor of the driver circuit has a first current flowing from a first terminal of the first transistor to a second terminal of the first transistor. A second transistor has a second current flowing from a first terminal of the second transistor to a second terminal of the second transistor. The first and the second transistor are arranged in a push-pull configuration. A first current source is connected to the first terminal of a first current mirror. The first current source controls the first current. A second current source is connected to the first terminal of a second current mirror. The second current source controls the second current. The dynamic DC bias and RF signal gain corresponds to a difference between the first current and the second current.

Another object of the invention is to provide a dynamic DC bias and RF signal gain to the base terminal of an output transistor by changing the ratio of the width of P-channel transistors with respect to N-channel transistors.

Another object of the invention is to provide dynamic DC bias and RF signal gain to the base terminal of the output transistor by adjusting the size of DC blocking capacitors through which an RF input signal is fed.

Another object of the invention is to provide dynamic DC bias and RF signal gain to the base terminal of the output transistor by varying a density of current flowing into the transistors arranged in push-pull configuration through the help of variable current sources.

Another object of the invention is to eliminate the need for impedance transformation at an input side of an output stage.

Another object of the invention is to provide dynamic intrinsic short circuit protection by limiting the DC bias signal during short circuit conditions at the output stage.

Another object of the invention is to adjust the gain expansion curve by adjusting the size of the driver stage.

Another object of the invention is to compensate for phase distortion in a driver stage and the output stage through the use of multiple parallel driver stages with different phase angles.

The present invention proposes an improved driver circuit for driving a Radio Frequency or Microwave power amplifier with built-in gain and bias current signal dependent expansion in order to obtain a maximum output power through a linearized power amplifier. In an embodiment, the driver circuit includes an output stage made of GaAs or GaN material which is integrated with a programmable driver stage having high voltage handling capability in order to attain high ruggedness and maximum output power through linearized transfer characteristics of the power amplifier.

An embodiment of the present invention, minimizes the amount of costly compound semiconductor material with low cost silicon material (in this case CMOS) while realizing only a final stage amplifier in a high power capable GaAs process within a single module. A silicon driver, realized in a CMOS process, enables flexibility provided by a digital programmability readily available in modern silicon processes. This enables optimization and enhancement of amplifier performance. A CMOS driver architecture also minimizes the size of the costly high power stage by eliminating the need for area consuming inter-stage matching components and bias circuitry by providing both DC and RF drive simultaneously.

Normally, the Radio Frequency hereinafter referred to as "RF" and Microwave amplifiers using a Bipolar and a Heterojunction Bipolar Transistor (HBT) are biased in an AB class mode. In this case, a diode of a reference biasing transistor is directly exposed to an RF input signal which creates a self biasing effect where a bias current increases with an increasing input power level. This, in turn, linearizes the transfer characteristics of the power amplifier, but makes the design very sensitive to parameter values chosen in a bias circuit and also engenders strange and undesirable frequency characteristics. The effects mentioned above are very hard to simulate and hence the design process becomes experimental and iterative which results in very long design cycles. Therefore, it makes the design very technology dependent and process transfers very complicated and expensive.

BRIEF DESCRIPTION OF THE DRAWINGS

Various embodiments of the invention will, hereinafter, be described in conjunction with the appended drawings provided to illustrate and not to limit the invention, wherein like designations denote like elements, and in which.

DETAILED DESCRIPTION OF THE PREFERRED EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention proposes an improved driver circuit for driving a Radio Frequency or Microwave power amplifier with built-in gain and bias current signal dependent expansion in order to obtain a maximum output power through a linearized power amplifier. In an embodiment, the driver circuit includes an output stage made of GaAs or GaN material which is integrated with a programmable driver stage having high voltage handling capability in order to attain high ruggedness and maximum output power through linearized transfer characteristics of the power amplifier.

An embodiment of the present invention, minimizes the amount of costly compound semiconductor material with low cost silicon material (in this case CMOS) while realizing only a final stage amplifier in a high power capable GaAs process within a single module. A silicon driver, realized in a CMOS process, enables flexibility provided by a digital programmability readily available in modern silicon processes. This enables optimization and enhancement of amplifier performance. A CMOS driver architecture also minimizes the size of the costly high power stage by eliminating the need for area consuming inter-stage matching components and bias circuitry by providing both DC and RF drive simultaneously.

Normally, the Radio Frequency hereinafter referred to as "RF" and Microwave amplifiers using a Bipolar and a Heterojunction Bipolar Transistor (HBT) are biased in an AB class mode. In this case, a diode of a reference biasing transistor is directly exposed to an RF input signal which creates a self biasing effect where a bias current increases with an increasing input power level. This, in turn, linearizes the transfer characteristics of the power amplifier, but makes the design very sensitive to parameter values chosen in a bias circuit and also engenders strange and undesirable frequency characteristics. The effects mentioned above are very hard to simulate and hence the design process becomes experimental and iterative which results in very long design cycles. Therefore, it makes the design very technology dependent and process transfers very complicated and expensive.

In view of the foregoing, the present invention proposes a different system in which the biasing circuit discussed above is replaced by the programmable driver stage which is coupled to base terminals of bipolar devices used in the output stage of the power amplifier which alleviates the disadvantages encountered by the prior art mentioned in the application.

Figure 1:
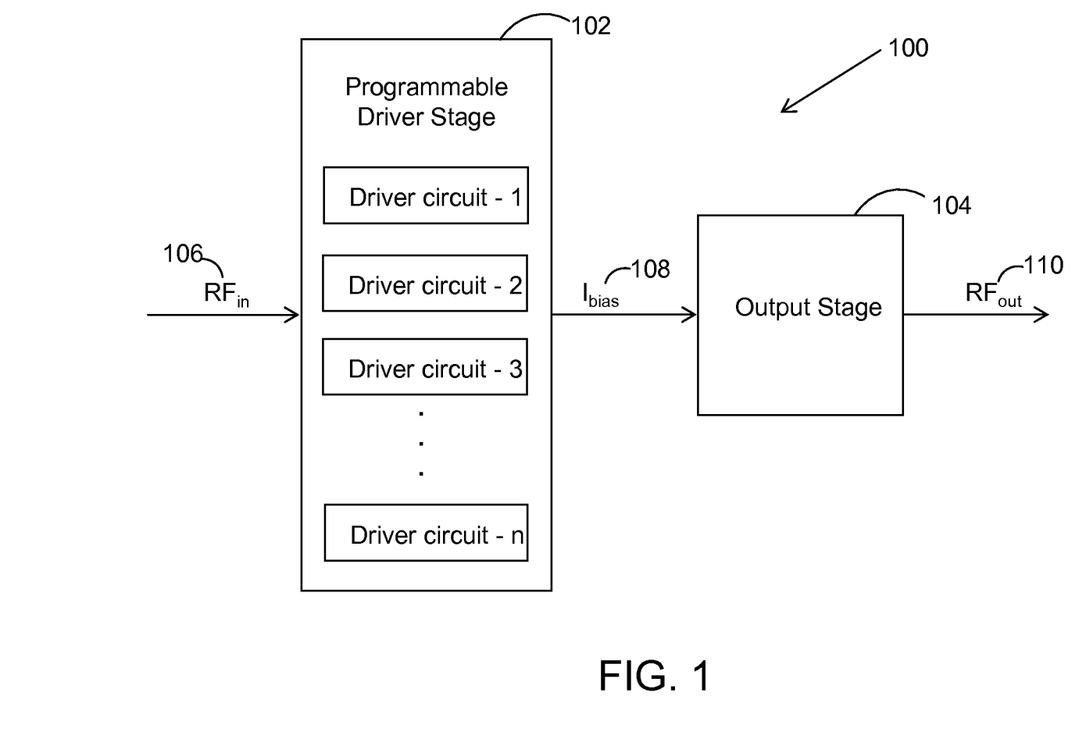
FIG. 1 is a block diagram showing the various components of a power amplifier including a programmable driver stage and an output stage 104 in accordance with an embodiment of the invention.

FIG. 1 is a block diagram showing the various components of a power amplifier 100 including a programmable driver stage 102 and an output stage 104, in accordance with an embodiment of the invention. Programmable driver stage 102 is configured to have a network of a plurality of driver circuits e.g. a first driver circuit, a second driver circuit, etc. Each driver may be configured to have a network of elements as for example: it may include one or more transistors, one or more current mirrors, one or more current sources, one or more delay elements and one or more resistive and capacitive elements. Each driver circuit in programmable driver stage 102 consists of two or more input lines and one output signal. Programmable driver stage 102 is connected to output stage 104 which consists of a network of one or more transistors along with inductive, capacitive and resistive elements fabricated on a Gallium Arsenide (GaAs) or a Gallium Nitride (GaN) die.

Radio Frequency input signal 106, hereinafter referred to as "input signal $RF_{in}$ 106" is first fed into programmable driver stage 102 which produces a DC bias signal, $I_{bias}$ 108. DC bias signal, $I_{bias}$ 108 is fed into output stage 104 which produces a Radio Frequency output signal 110, hereinafter referred to as "output signal $RF_{out}$ 110". Output signal RFout 110 corresponds to an amplified Radio frequency input signal 106. In an embodiment of the invention, when there are two driver circuits in programmable driver stage 102, then DC bias signal, $I_{bias}$ 108 that comes out of programmable driver stage 102 is the sum of the DC bias signals from the two driver circuits. In an embodiment of the present invention, the network of one or more transistors at output stage 104 corresponds to one of: a Bipolar Junction transistor (BJT), a Heterojunction Bipolar Transistor (HBT) and a pHEMT (pseudo High Electron Mobility Transistor).

Figure 2:
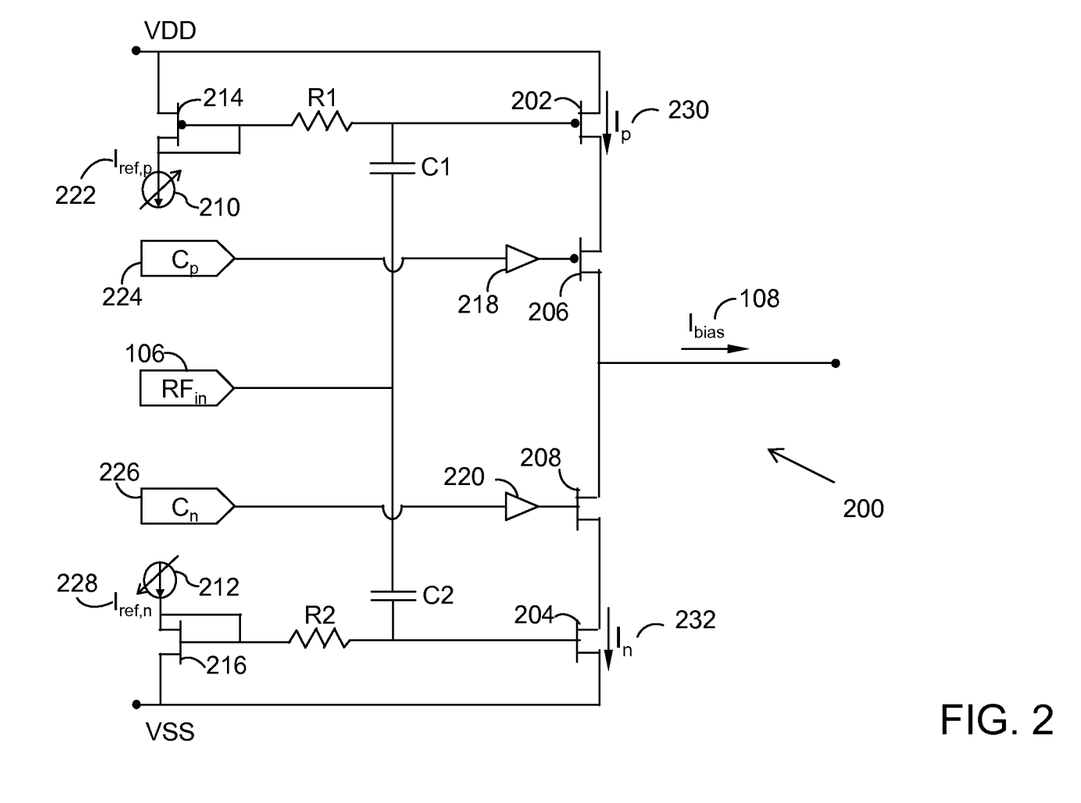
FIG. 2 is a schematic circuit diagram illustrating various components of a driver circuit located in a power amplifier, in accordance with an embodiment of the invention.

FIG. 2 is a schematic circuit diagram illustrating the various components of a driver circuit 200 located in a power amplifier, in accordance with an embodiment of the invention. FIG. 2 is shown to include a first transistor 202, a second transistor 204, a third transistor 206, a fourth transistor 208, a first current source 210, a second current source 212, a first current mirror 214, a second current mirror 216, a first delay element 218, a second delay element 220, a resistor R1, a resistor R2, a capacitor C1 and a capacitor C2. In various embodiments, first transistor 202, second transistor 204, third transistor 206, fourth transistor 208, first current mirror 214 and second current mirror 216 correspond to one of: Bipolar Complementary Metal Oxide Semiconductor (BiCMOS) transistors, Silicon-Germanium Bipolar Complementary Metal Oxide Semiconductor (SiGe BiCMOS) transistors, Pseudomorphic High Electron Mobility Transistor (pHEMT), Silicon on Insulators-Complementary Metal Oxide Semiconductor (SOI-CMOS) transistors and Silicon on Insulators-Bipolar Complementary Metal Oxide Semiconductor (SOI-BiCMOS) transistors.

First current source 210 of driver circuit 200 is connected to a drain terminal of first current mirror 214. First current source 210, which is a variable DC current source, feeds a reference DC current 222, hereinafter referred to as "reference current $I_{ref,p}$ 222" into the drain terminal of first current mirror 214. A gate terminal of first current mirror 214 is shorted with the drain terminal of the same. Further, an RC parallel circuit which consists of resistor R1 and capacitor C1 is connected in series between the gate terminal of first current mirror 214 and a gate terminal of first transistor 202. A drain terminal of first transistor 202 is connected to a source terminal of third transistor 206 and a source terminal of both first transistor 202 and first current mirror 214 is connected to a first voltage source, hereinafter referred to as "VDD". A first control signal 224, hereinafter referred to as "$C_p$ control signal 224" is provided to a gate terminal of third transistor 206 through a first delay element 218.

Further, a drain terminal of third transistor 206 is connected to a drain terminal of fourth transistor 208. A gate terminal of fourth transistor 208 is controlled using a second control signal 226, hereinafter referred to as "$C_n$ control signal 226". $C_n$ control signal 226 is applied to the gate terminal of fourth transistor 208 through a second delay element 220 connected to it. Further, a source terminal of fourth transistor 208 is connected to a drain terminal of second transistor 204. A gate terminal of second transistor 204 is connected to a gate terminal of second current mirror 216. An RC parallel circuit consisting of a resistor R2 and capacitor C2 is connected between the gate terminal of second current mirror 216 and the gate terminal of second transistor 204. In an embodiment of the invention, $C_p$ control signal 224 and $C_n$ control signal 226 provided to the gate terminals of third and fourth transistor 206 and 206 are direct current (DC) signals.

The free ends of the two capacitors C1 and C2 are, in turn, connected in series with each other which has input signal $RF_{in}$ 106 connected midway between them. The gate terminal of second current mirror 216 is shorted with a drain terminal of the same, where the drain terminal is, in turn, connected to second current source 212. Second current source 212 which is yet another variable DC current source feeds a reference DC current 222, hereinafter referred to as "reference current $I_{ref,n}$ 222" into the drain terminal of second current mirror 216. Furthermore, a source terminal of both second current mirror 216 and second transistor 204 are connected to a second voltage source, hereinafter referred to as "VSS".

In an embodiment of the invention, first current mirror 214, first transistor 202 and third transistor 206 belong to P-channel transistors, whereas second current mirror 216, second transistor 204 and fourth transistor 208 belong to the N-Channel transistors.

Figure 3:
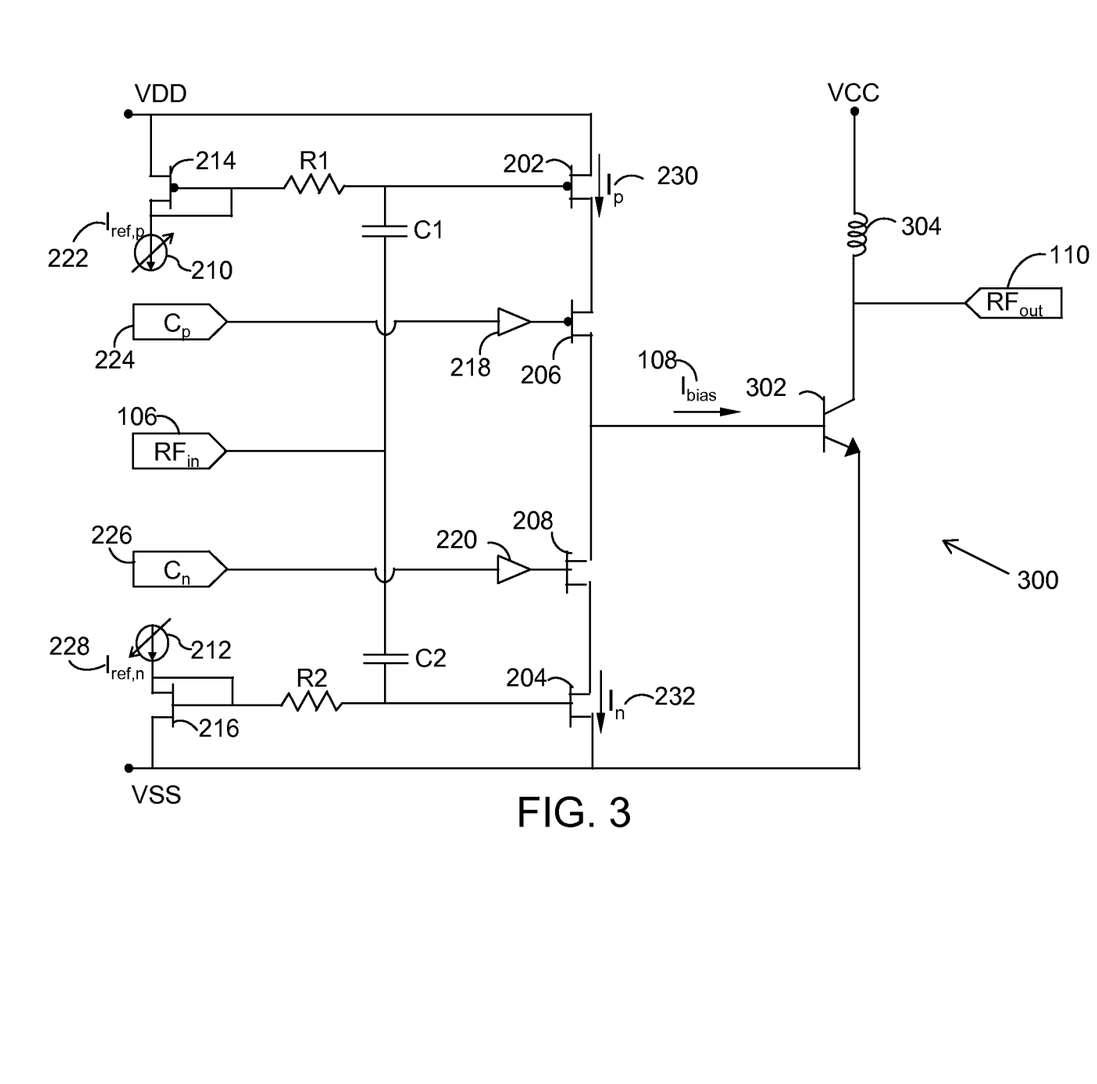
FIG. 3 is a schematic circuit diagram illustrating the various components of the power amplifier, in accordance with an embodiment of the invention.

FIG. 3 is a schematic circuit diagram illustrating the various components of power amplifier 300, in accordance with an embodiment of the invention. Power amplifier 300 includes the elements illustrated to be a part of driver circuit 200 (refer FIG. 2) except for output transistor 302 which has been included. Further, power amplifier 200 has component connection configuration identical to driver circuit 200 except that the drain terminal of third and fourth transistor 206 and 208 is connected to the base terminal of an output transistor 302. A base terminal of an output transistor 302 is connected to a common node located between the drain terminals of both third transistor 206 and fourth transistor 208. An emitter terminal of output transistor 302 is connected to VSS. A collector terminal of output transistor 302 is connected to an RF choke 304 which is connected to a third voltage source, hereinafter referred to as "VCC". Output signal $RF_{out}$ 110 is taken out of the collector terminal of output transistor 302 where output transistor 302 belongs to Heterojunction Bipolar Transistor (HBT).

First current source 210 provides reference current $I_{ref,p}$ 222 that flows into first current mirror 214 which is a diode connected P-channel device. Reference current $I_{ref,p}$ 222 controls the dc bias point for first transistor 202 such that first transistor 202 and third transistor 206 has a DC current, $I_p$ 230 flowing through them. The resistor R1 connected between first current mirror 214 and first transistor 202 acts as an RF block that blocks the RF component of the input signal from passing through it and also into first current mirror 214. Similarly, second current source 212 provides reference current $I_{ref,n}$ 228 that flows in to second current mirror 216 which is a diode connected N-channel device. Reference current $I_{ref,n}$ 222 controls the DC bias point for second transistor 204 such that second transistor 204 and fourth transistor 208 that has a DC current, $I_n$ 232 flowing through them. The resistor R2 connected between second current mirror 216 and second transistor 204 functions the same way as resistor R1 that blocks the RF component of the input signal from passing through it and also into second current mirror 216. The capacitors C1 and C2 connected to $RF_{in}$ act as DC blocking capacitors that blocks any DC component of input signal $RF_{in}$ 106 from passing through them. $C_p$ control signal 224 and $C_n$ control signal 226 controls the bias point of third transistor 206 and fourth transistor 208, respectively. Further, it controls density of current that is fed to the gate terminal of third transistor 206 and fourth transistor 208 along with determining the amount of DC bias signal $I_{bias}$ 108 that flows toward output stage 104.

In an embodiment of the invention, first and third transistors 202 and 206 are connected together in a cascode configuration and second and fourth transistors 204 and 208 are connected together in another cascode configuration. First current source 210 serves first and third transistors 202 and 206 while second current source 212 serves second and fourth transistors 204 and 208. The ratio of the current flowing into the P-channel transistors (including first current mirror 214, first transistor 202 and third transistor 206) and the N-channel transistors (including second current mirror 216, second transistor 204 and fourth transistor 208) can be changed by adjusting first and second current source 210 and 212 respectively.

Therefore, when there is more current flowing into the P-channel transistors (first current mirror 214, first transistor 202 and third transistor 206) than in the N-channel transistors (second current mirror 216, second transistor 204 and fourth transistor 208), the difference between the two currents $I_p$ 230 and $I_n$ 232 gets dumped into the base of output transistor 302. In order to provide an offset between the two currents $I_p$ 230 and $I_n$ 232, first and second current sources 210 and 212 must be adjusted to get a quiescent current up at the base of output transistor 302. The quiescent current acts as DC bias current, $I_{bias}$ 108 that provides the common node voltage at the drain output of third transistor 206 and fourth transistor 208. The DC bias current, $I_{bias}$ 108 drives output transistor 302 and also sets up the DC bias for the overall circuit.

The two DC blocking capacitors C1 and C2 are connected independently so that the DC bias current of first transistor 202 and third transistor 206 can be controlled independently from second transistor 204 and fourth transistor 208. Also this provides an added advantage of biasing first transistor 202 and third transistor 206 differently from second transistor 204 and fourth transistor 208 in any suitable class (i.e.) AB class, A class, B class, etc and thereby have independent control over them. In an embodiment of the present invention, first transistor 202 and second transistor 204 alone (or) first and third transistor 202 and 206 together with second and fourth transistor 204 and 208 can provide a push-pull configuration. In other words, they are push-pull amplifiers that amplify the input signal $RF_{in}$ 106 through all the transistors in driver stage 102 as a pre-amplification stage for output stage 104 of output transistor 302.

Further, output transistor 302 can also be biased in any mode, typically in AB class mode and output transistor 302 provides the final power amplification to the input signal $RF_{in}$ 106. RF choke 304 connected to the collector terminal of output transistor 302 provides the required DC and RF impedance so as to provide the required DC bias and RF gain at the output. Cp control signal 224 and Cn control signal 226, which control an effective size of output stage 104 realized in first and second transistor 202 and 204, respectively can be applied by either switching on or off fingers in the cascode devices or alternatively by switching on or off fingers into first and second current mirror 214 and 216.

Figure 4:
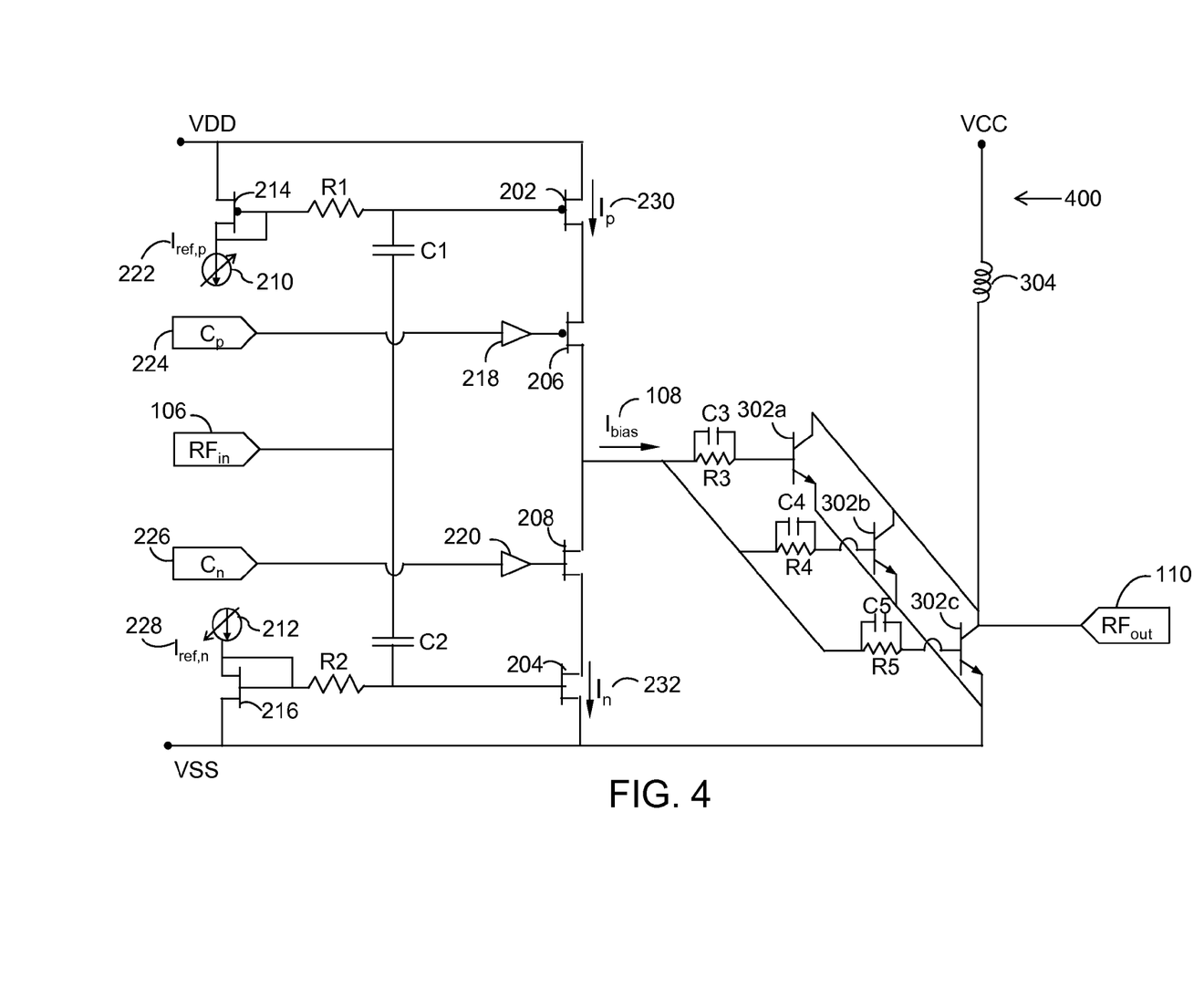
FIG. 4 is a schematic circuit diagram illustrating various components of the power amplifier, in accordance with another embodiment of the invention.

FIG. 4 is a schematic circuit diagram illustrating various components of power amplifier 400, in accordance with another embodiment of the invention. Power amplifier 400 includes the elements illustrated to be a part of power amplifier 300 (refer to FIG. 3) except for output transistor 302 which has been removed. Further, power amplifier 400 has a component connection configuration identical to power amplifier 300 except for the drain terminal of third and fourth transistor 206 and 208 which is connected to a network of transistors, resistive elements and capacitive elements whose connections are discussed hereafter. The drain terminal of third and fourth transistor 206 and 208 is connected to a resistor R3 which has a capacitor C3 connected in parallel to it. The other end of resistor R3 is connected to a base terminal of a transistor 302a. Further, an RC parallel circuit consisting of a resistor R4 and a capacitor C4 are connected between the drain terminal of third and fourth transistor 206 and 208 and the base terminal of a transistor 302b.

Yet another RC parallel circuit consisting of the resistor R5 and capacitor C5 are connected between third and fourth transistor 206 and 208 and the base terminal of a transistor 302c. The emitter terminals of transistors 302a, 302b, and 302c are coupled together and connected to VSS. Further, the collector terminals of transistors 302a, 302b and 302c are coupled together and connected to RF choke 304 which is in turn connected to VCC. Output signal $RF_{out}$ 110 is taken from the collector terminals of transistors 302a, 302b and 302c. Further, the functional operation of components shown in power amplifier 300 and power amplifier 400 may be identical.

In order to keep the current through all bipolar transistors 302a, 302b and 302c same, the concept of base ballasting is utilized. Base ballasting helps to avoid thermal feedback based current inequalities between the different cells of the design. According to the concept of base ballasting, every sub-cell of bipolar transistor 302a, 302b and 302c has resistors R3, R4, R5 respectively having a small resistance in their base terminal. In order to recover the gain, resistors R3, R4 and R5 are shorted with capacitors C3, C4 and C5 respectively. The capacitors C3, C4 and C5 do not harm the concept of base ballasting as they are cancelled by an inductance connected in series with the RC parallel circuit. The inductance in this case happens to be naturally occurring in the connection between a CMOS die (driver stage 102) and a GaAs die (output stage 104) providing proper ballasting while maintaining the AC gain.

Figure 5:
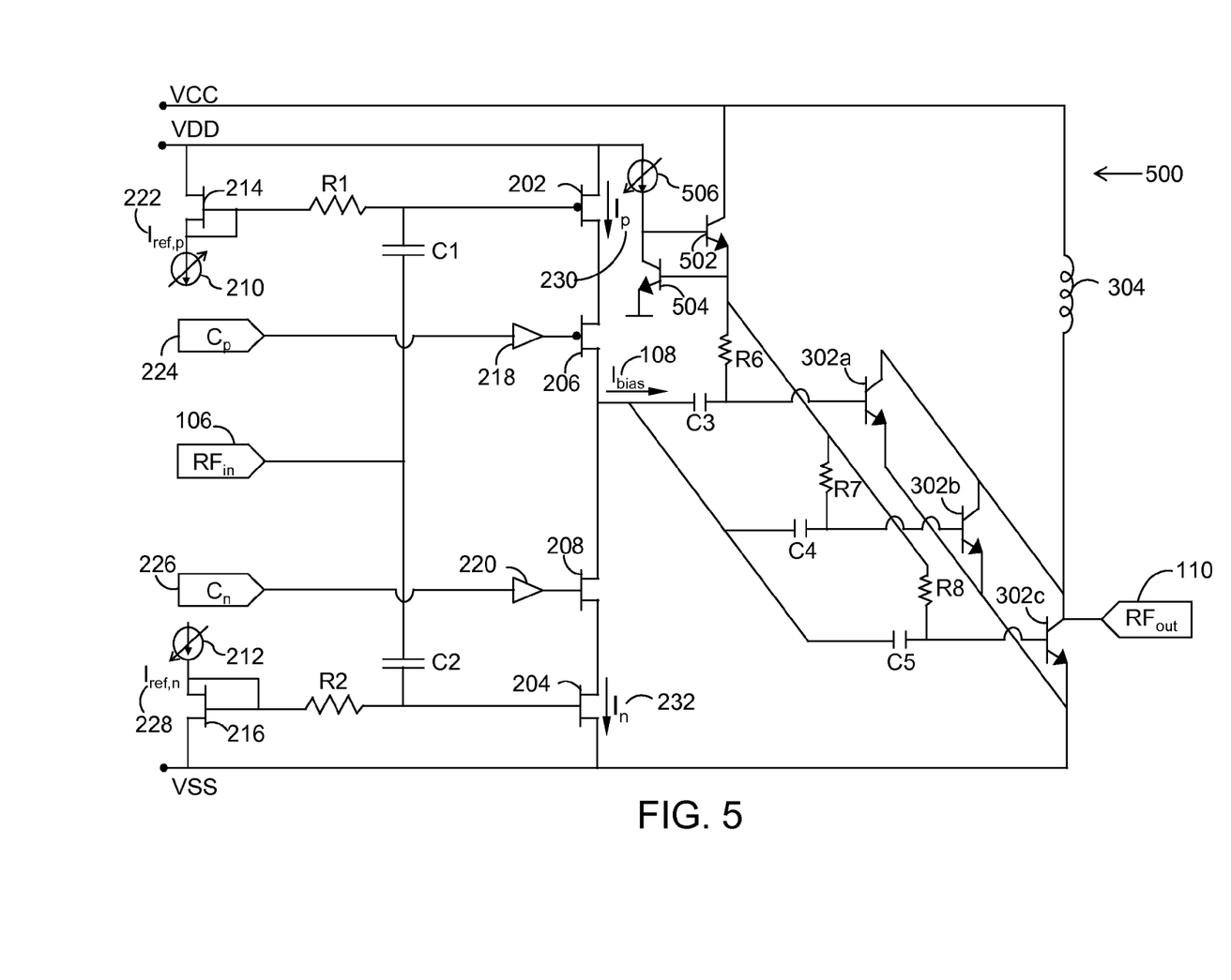
FIG. 5 is a schematic circuit diagram illustrating various embodiments of the power amplifier, in accordance with yet another embodiment of the invention.

FIG. 5 is a schematic circuit diagram illustrating various embodiments of a power amplifier 500, in accordance with yet another embodiment of the invention. Power amplifier 500 includes the elements illustrated to be a part of power amplifier 400 (refer to FIG. 4) except for the inclusion of two NPN transistors 502 and 504 along with a third current source 506 placed in output stage 104 of power amplifier 500. Also resistors R3, R4 and R5 in FIG. 4 have been removed and resistors R6, R7 and R8 have been added. Third current source 506 is a variable DC current source.

In this embodiment of the present invention, a collector terminal of transistor 502 is connected to VCC. A collector terminal of transistor 504 is connected to third current source 506. Third current source 506 has a direct control over the DC bias current, $I_{bias}$ 108. A base terminal of transistor 502 is coupled with the collector terminal of transistor 504. An emitter terminal of transistor 502 is connected to a base terminal of transistor 504. An emitter terminal of transistor 504 is grounded, whereas the emitter terminal of transistor 502 is connected to a resistor R6.

Resistor R6 is connected in series with capacitor C3. One end of capacitor C3 is connected to the base terminal of transistor 302a. While the other end of capacitor C3 is connected in parallel with capacitor C4 which has resistor R7 connected in series with it. One end of capacitor C4 is connected to the base terminal transistor 302b while the other end is connected in parallel to capacitor C5. Resistor R8 is connected in series with capacitor C5. Capacitor C5 is connected to the base terminal of transistor 302c. Resistors R6, R7 and R8 are coupled together and connected to the emitter terminal of transistor 502. Further, the functional operations of components are shown to be identical in power amplifier 400 and power amplifier 500.

In this embodiment, the functionality of power amplifier 500 can also be realized by using gain generated by third current source 506 on driver stage 102 together with a current mirror on output stage 104. In this manner the base line gain expansion can be achieved in a classic fashion by self biasing of the current mirror on output stage 104. However, driver stage 102 would only provide the required RF gain.

Figure 6:
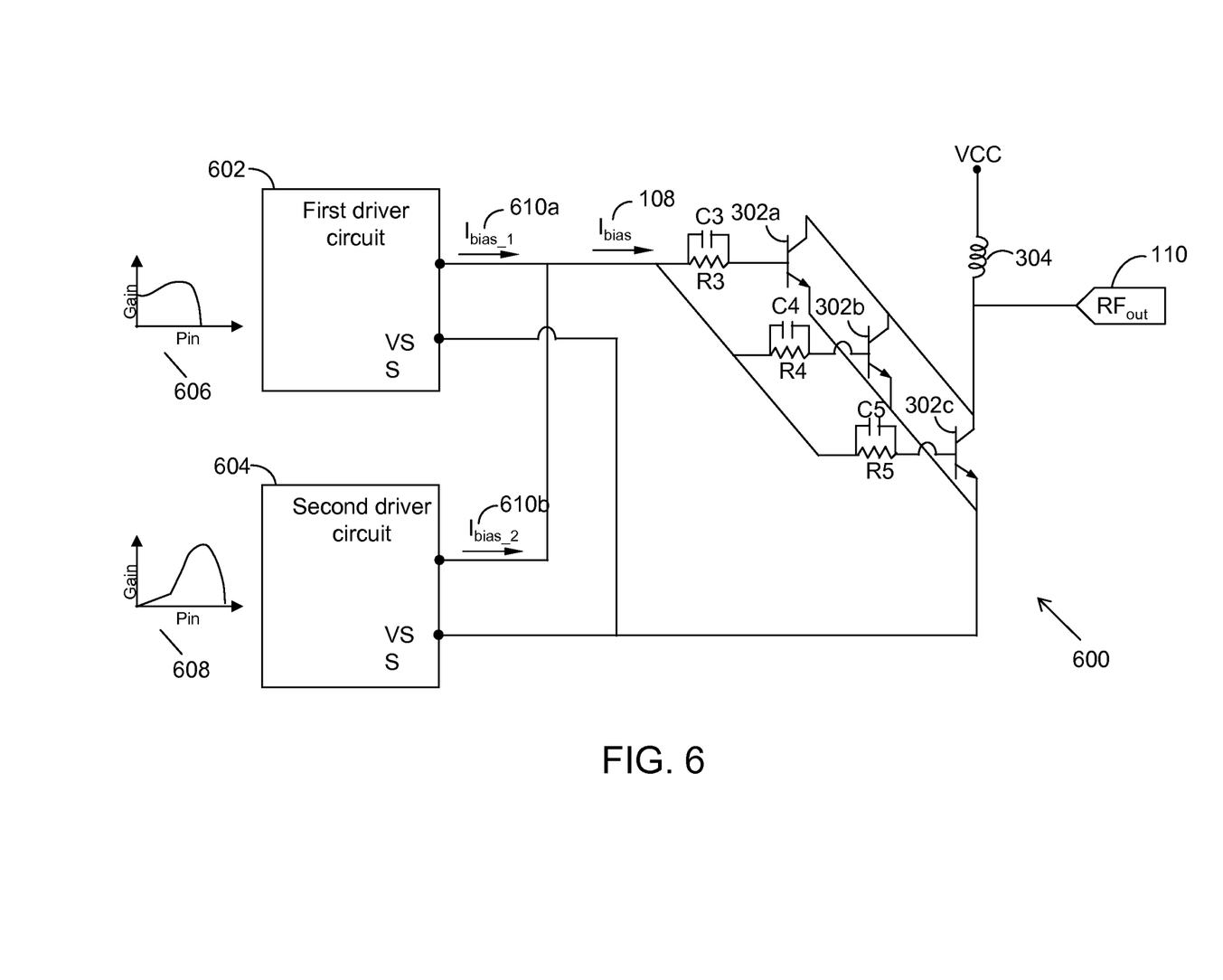
FIG. 6 is a schematic circuit diagram illustrating multiple driver circuits employed for driving a power amplifier, in accordance with still another embodiment of the invention.

FIG. 6 is a schematic circuit diagram illustrating multiple driver circuits employed for driving a power amplifier 600, in accordance with still another embodiment of the invention. FIG. 6 is explained, in detail, in conjunction with FIG. 2 and FIG. 4.

Power amplifier 600 includes elements illustrated to be a part of power amplifier 400 (refer to FIG. 4) except for the inclusion of multiple driver circuits connected in parallel. Power amplifier 600 is shown to include a first driver circuit 602 and a second driver circuit 604 connected in parallel. The circuit elements of first and the second driver circuit 602 and 604 correspond to the circuit elements illustrated to be a part of driver circuit 200 (refer to FIG. 2) retaining their functionalities. Further, the common nodes of both first driver circuit 602 and second driver circuit 604 are coupled together and fed to the RC parallel circuit consisting of resistor R3 and capacitor C3. It is to be noted that several of these driver circuits can be connected in parallel to drive the transistors at output stage 104.

A first RF signal, having a gain curve as depicted by 606 is fed into first driver circuit 602. A second RF signal, having gain curve as depicted by 608 is fed into second driver circuit 604. First driver circuit 602 produces a first bias current ($I_{bias\_1}$) 610a. Second driver circuit 604 produces a second bias current ($I_{bias\_2}$) 610b. First and second bias current 610a and 610b are added together to produce the DC bias signal, $I_{bias}$ 108. The DC bias signal, $I_{bias}$ 108 drives the transistors at output stage 104 in order to obtain the desired current expansion and signal expansion. Therefore, by putting multiple DC driver circuits with different bias points in parallel, multiple gain expansion curves can be used to achieve proper pre-distortion in driver stage 102 to equalize any gain distortion caused by output stage 104. Hence, by placing multiple push-pull direct coupled driver circuits in parallel and biasing each driver circuit in different class of operation (e.g. Class A, Class B, Class AB etc) simultaneously by providing feed forward pre-distortion to compensate for non-linearities near the gain compression point of the transistors in output stage 104, the linearity and power added efficiency of output stage 104 can be improved.

In an embodiment of the invention, the phase distortion encountered by driver stage 102 and output stage 104 while going into compression can be compensated by driving the multiple driver circuits in parallel with different phase angles.

Figure 7:
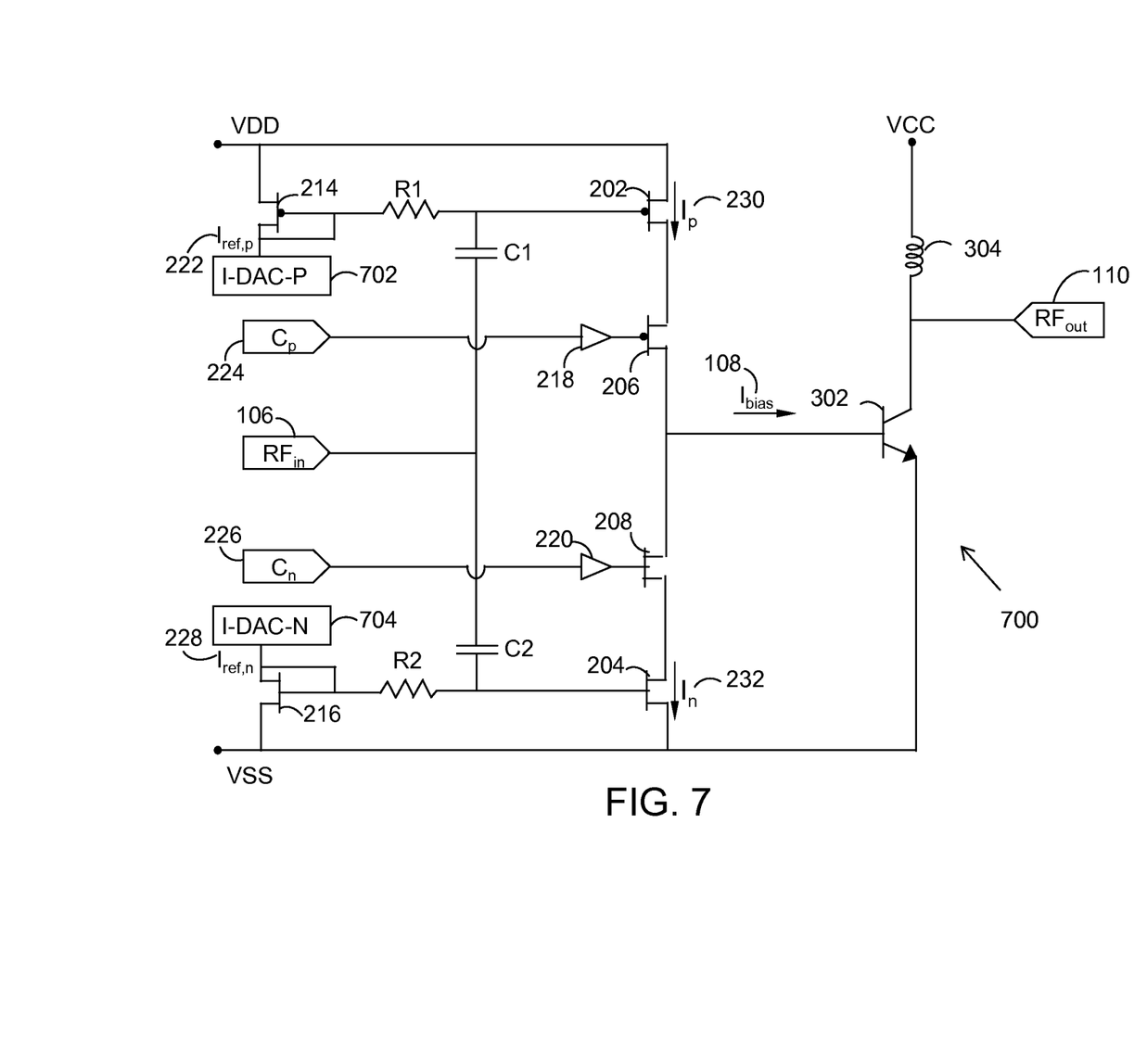
FIG. 7 is a schematic circuit diagram illustrating various embodiments of the power amplifier, in accordance with still another embodiment of the invention.

FIG. 7 is a schematic circuit diagram illustrating various embodiments of a power amplifier 700, in accordance with still another embodiment of the invention. Power amplifier 700 includes the elements illustrated to be a part of power amplifier 300 (refer to FIG. 3) except that first and second current source 210 and 212 are replaced by I-DAC-P 702 and I-DAC-N 704, respectively. I-DAC-P 702 and I-DAC-N 704 use a current Digital to Analog Conversion (DAC) function. By using I-DAC-P 702 and I-DAC-N 704, the current fed to first and second current mirrors 214 and 216, respectively can be controlled in digital manner. Therefore, by digitally controlling first and second current mirror 214 and 216, desired gain expansion can be achieved at output stage 104.

In an embodiment of the invention, by controlling the density of the DC bias current, $I_{bias}$ 108, the current density in output transistor 302 can be controlled. This facilitates in the adjustment of the gain and bias current of output transistor 302 by DC driver stage 102.

In an alternate embodiment of the invention, the amplitude of a RF signal coming into the P-channel transistors versus the amplitude of RF signal coming into the N-channel transistors can be changed. This way, bias current $I_{bias}$ 108 flowing out of the P-channel transistors into output stage 104 can be changed as the amplitude is varied. In other words, output stage 104 can be linearized by keeping the size of the P-channel transistors and the N-channel transistors fixed by independently adjusting the gain of input signal $RF_{in}$ 106 fed into first transistor 202 and second transistor 204.

In yet another embodiment of the invention, driver stage 102 can be made to provide DC bias current, $I_{bias}$ 108 and RF signal gain to the base terminal of output transistor 302 by adjusting the gain of the push-pull amplifiers which includes first transistor 202 and second transistor 204 alone (or) first and third transistor 202 and 206 together with second and fourth transistor 204 and 208. The gain can be adjusted by either changing the ratio of the width of the P-channel transistors to the width of the N-channel transistors by adjusting the density of current flowing into the transistors. Alternatively, the gain can be adjusted by adjusting the size of capacitors C1 and C2 shown in FIG. 2 so that the DC bias current, $I_{bias}$ 108 flowing from driver stage 102 into output stage 104 dynamically increases as the amplitude of the input signal $RF_{in}$ 106 increases.

In yet another embodiment of the invention, the size of driver stage 102 can be adjusted in order to adjust the gain expansion curve. The adjustment of the gain expansion curve compensates for the gain loss that occurs in the transistors in output stage 104 when they get into compression. Alternatively, the gain loss can be compensated by making the size of the driver circuit adjustable to adjust the gain expansion curve.

Yet another way to compensate for the gain variation at driver stage 102 and output stage 104 that had occurred due to process, supply voltage and temperature variation is to adjust the size of driver stage 102. On the other hand, the DC bias current, $I_{bias}$ 108 could alternatively be adjusted to compensate for the gain variation at output stage 104 which had occurred due to fabrication process, supply voltage and temperature variation.

The main advantage of this invention is that driver stage 102 consisting of push-pull amplifiers eliminates the need for impedance transformation at an input side of output stage 104 due to similar RF impedance levels between the output from driver stage 102 and the input to output stage 104. This results in an improved power gain performance of multi-stage power amplifiers by reducing losses and by eliminating costly inter-stage matching components. Further, driver stage 102 consisting of push-pull amplifiers along with output amplifier 302 at output stage 104 provides intrinsic short circuit protection by inherently limiting the DC bias current, $I_{bias}$ 108 during short circuit load conditions in output stage 104.

Another advantage of the present invention is the ability to control the gain expansion achieved by output stage 104 by just adjusting the RF power to DC current expansion ratio at an input to output stage 104. The adjustment can be performed by changing the width of the push-pull transistors by adjusting the density of current flowing through these transistors (inclusive of first transistor 202, second transistor 204, third transistor 206 and fourth transistor 208) through $C_p$ and $C_n$ control signals 224 and 226, or by changing the ratio of capacitor C1 to capacitor C2 size, or by adjusting the amplitude of the input signal $RF_{in}$ 104 at first transistor 202 and second transistor 204 independently.

Yet another advantage of the present invention is the ability to adjust the DC drive current, $I_{bias}$ 108 and its drive strength by sensing the bias point and the bias point shift of the of output transistor 302 in output stage 104.

Therefore, the present invention proves to be advantageous in comparison with the conventional systems by way of providing a direct DC coupled push-pull driver circuit with built-in gain and bias current signal expansion.

While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A driver circuit configured to provide dynamic DC bias and RF signal gain to a base terminal of a Bipolar Junction Transistor (BJT) power device in a power amplifier, the driver circuit comprising:
   a first transistor with a first current flowing from a first terminal of the first transistor to a second terminal of the first transistor;
   a second transistor with a second current flowing from a first terminal of the second transistor to a second terminal of the second transistor, wherein the first transistor and the second transistor are in a push-pull configuration;
   a first current source connected to a first terminal of a first current mirror, wherein the first current source controls the first current; and
   a second current source connected to a first terminal of a second current mirror, wherein the second current source controls the second current, the dynamic DC bias and the RF signal gain corresponding to a difference between the first current and the second current, wherein changing the ratio of the width of the first transistor to the width of the second transistor provides the dynamic DC bias and the RF signal gain to the base terminal of the Bipolar Junction Transistor (BJT) power device in the power amplifier.

2. The driver circuit of claim 1 further comprising a first resistor connecting a second terminal of the first current mirror and a third terminal of the first transistor in such a manner that the first current mirror mirrors the first current on to the first transistor, wherein the second terminal of the first transistor connects to the first terminal of the second transistor.

3. The driver circuit of claim 1 further comprising a second resistor connecting a second terminal of the second current mirror and a third terminal of the second transistor in such a manner that the second current mirror mirrors the second current on to the second transistor.

4. The driver circuit of claim 1, wherein the first transistor, the second transistor, the first current mirror and the second current mirror correspond to at least one of: a Bipolar Complementary Metal Oxide Semiconductor (BiCMOS) transistor, a Silicon-Germanium Bipolar Complementary Metal Oxide Semiconductor (SiGe BiCMOS) transistor, a Pseudomorphic High Electron Mobility Transistor (pHEMT), a Silicon on Insulator-Complementary Metal Oxide Semiconductor (SOI-CMOS) transistor and a Silicon on Insulator-Bipolar Complementary Metal Oxide Semiconductor (SOI-BiCMOS) transistor.

5. The driver circuit of claim 1 further comprising a first capacitor and a second capacitor connected in series to a third terminal of the first transistor and the third terminal of the second transistor.

6. The driver circuit of claim 5, wherein adjusting the size of the first and the second capacitors provides the dynamic DC bias and the RF signal gain to the base terminal of the Bipolar Junction Transistor (BJT) power device in the power amplifier.

7. The driver circuit of claim 1, wherein the first current source and the second current source comprises a Digital to Analog Converter (DAC) to control the first current and the second current, respectively.

8. The driver circuit of claim 1 further comprising:
   a third transistor with a first terminal of the third transistor connected to the second terminal of the first transistor;
   a fourth transistor with a first terminal of the fourth transistor connected to the first terminal of the second transistor, wherein a second terminal of the third transistor is connected to a second terminal of the fourth transistor;
   a first delay element connected to a third terminal of the third transistor, a first control signal being fed to the first delay element; and
   a second delay element connected to a third terminal of the fourth transistor, a second control signal being fed to the second delay element.

9. The driver circuit of claim 8, wherein the first transistor and the third transistor are connected together in cascode configuration and the second transistor and the fourth transistor are connected together in cascode configuration.

10. The driver circuit of claim 9, wherein the first transistor and the first current mirror are P-channel Metal Oxide Semiconductor (PMOS) transistors; and the second transistor and the second current mirror are N-channel Metal Oxide Semiconductor (NMOS) transistors.

11. The driver circuit of claim 8, wherein the third transistor is P-channel Metal Oxide Semiconductor (PMOS) transistor; and the fourth transistor is N-channel Metal Oxide Semiconductor (NMOS) transistor.

12. The driver circuit of claim 1, wherein the BJT is a Heterojunction Bipolar Transistor.

13. The driver circuit of claim 1, wherein the BJT is a pseudomorphic High Electron Mobility Transistor.

14. The driver circuit of claim 7, wherein a quiescent bias current for the Bipolar Junction Transistor (BJT) power device is set by adjusting a first DAC and a second DAC so that a DC bias current flows into the base of the BJT power device.

15. The driver circuit of claim 10, wherein the dynamic DC bias current and RF signal to the Bipolar Junction Transistor (BJT) are controlled by a first control signal and a second control signal which adjust the size of the cascoded PMOS and the cascoded NMOS transistor respectively.

16. A driver circuit configured to provide dynamic DC bias and RF signal gain to a base terminal of a Bipolar Junction Transistor (BJT) power device in a power amplifier, the driver circuit comprising:
   a first transistor with a first current flowing from a first terminal of the first transistor to a second terminal of the first transistor;
   a second transistor with a second current flowing from a first terminal of the second transistor to a second terminal of the second transistor, wherein the first transistor and the second transistor are in a push-pull configuration;
   a first current source connected to a first terminal of a first current mirror, wherein the first current source controls the first current; and
   a second current source connected to a first terminal of a second current mirror, wherein the second current source controls the second current, and wherein the first current source and the second current source comprises a Digital to Analog Converter (DAC) to control the first current and the second current.

17. A driver circuit configured to provide dynamic DC bias and RF signal gain to a base terminal of a Bipolar Junction Transistor (BJT) power device in a power amplifier, the driver circuit comprising:
   a first transistor with a first current flowing from a first terminal of the first transistor to a second terminal of the first transistor;
   a second transistor with a second current flowing from a first terminal of the second transistor to a second terminal of the second transistor, wherein the first transistor and the second transistor are in a push-pull configuration;

a first current source connected to a first terminal of a first current mirror wherein the first current source controls the first current;

a second current source connected to a first terminal of a second current mirror, wherein the second current source controls the second current, the dynamic DC bias and RF signal gain corresponding to a difference between the first current and the second current; and a first capacitor and a second capacitor connected in series to a third terminal of the first transistor and a third terminal of the second transistor, wherein adjusting the size of the first and the second capacitors provides the dynamic DC bias and the RF signal gain to the base terminal of the Bipolar Junction Transistor (BJT) power device in the power amplifier.

* * * * *